US007007262B2

(12) United States Patent
Kurokawa et al.

(10) Patent No.: US 7,007,262 B2
(45) Date of Patent: Feb. 28, 2006

(54) HIGH LEVEL SYNTHESIS METHOD AND APPARATUS

(75) Inventors: Keiichi Kurokawa, Hyogo (JP); Osamu Ogawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 213 days.

(21) Appl. No.: 10/291,790

(22) Filed: Nov. 12, 2002

(65) Prior Publication Data

US 2003/0126580 A1    Jul. 3, 2003

(30) Foreign Application Priority Data

Nov. 15, 2001    (JP) ............................. 2001-349535

(51) Int. Cl.
    *G06F 17/50*    (2006.01)
(52) U.S. Cl. ............................................ 716/18; 716/6
(58) Field of Classification Search ................ 716/1–3, 716/18, 6
    See application file for complete search history.

(56) References Cited

U.S. PATENT DOCUMENTS

| 5,764,591 | A  |   | 6/1998  | Matsui et al. |        |
|-----------|----|---|---------|---------------|--------|
| 5,764,951 | A  | * | 6/1998  | Ly et al. ........................ | 716/1  |
| 6,044,211 | A  | * | 3/2000  | Jain ............................ | 716/18 |
| 6,195,786 | B1 | * | 2/2001  | Raghunathan et al. ......... | 716/2  |
| 6,324,678 | B1 |   | 11/2001 | Dangelo et al. |        |
| 6,367,066 | B1 | * | 4/2002  | Sato ............................ | 716/18 |
| 6,505,340 | B1 |   | 1/2003  | Nishida et al. |        |
| 6,539,537 | B1 | * | 3/2003  | Nakamura et al. ............ | 716/18 |
| 6,687,894 | B1 |   | 2/2004  | Ohnishi et al. |        |
| 6,745,160 | B1 |   | 6/2004  | Ashar et al. |        |
| 6,782,354 | B1 | * | 8/2004  | Ikegami ........................ | 703/2  |
| 2002/0162097 | A1 | * | 10/2002 | Meribout ..................... | 717/155 |

OTHER PUBLICATIONS

"A Magnetoelectronic Macrocell Employing Reconfigurable Threshold Logic", Steve P. Ferrera and Nicholas P. Carter, University of Illinois.

* cited by examiner

*Primary Examiner*—Paul Dinh
(74) *Attorney, Agent, or Firm*—McDermott Will & Emery LLP

(57) ABSTRACT

A behavioral description is converted to a CDFG. The CDFG is scheduled in such a way that the number of registers is minimized with a desired number of clock cycles. Hardware is allocated to the scheduled results. The minimum clock period (semi-synchronous minimum clock period) attainable by adjusting clock timings for allocated registers is determined. When the semi-synchronous minimum clock period is greater than a desired clock period, all the clock timings are reset to a same value and then the positions of the registers in the CDFG are so changed as to reduce the clock period. The processing returns to the step of determining the semi-synchronous minimum clock period when the performance is improved as a result of performing retiming, or otherwise is terminated.

32 Claims, 7 Drawing Sheets

HIGH LEVEL SYNTHESIS METHOD AND APPARATUS

BACKGROUND OF THE INVENTION

The present invention relates to a high level synthesis method and apparatus for automatically synthesizing a register transfer level (RTL) circuit description from circuit specifications in behavioral description.

With the recent trend toward a larger scale and a shorter product cycle of LSI circuits, improvement in productivity of LSI design has become highly important. The high level synthesis technology, realizing automatic synthesis of a register transfer level (RTL) circuit description from circuit specifications in behavioral description, is known as an effective means for improving the productivity of LSI design.

For mobile equipment such as cellular phones, of which market is expected to expand further increasingly in the future, power consumption of LSI is a critical factor and should be considered in the high level synthesis technology. In the high level synthesis technology, lower power consumption has been attained by providing a smaller number of registers to implement a RTL circuit. For example, reduction of the number of registers by sharing registers is proposed in Daniel Gajski, Nikil Dutt, Allen Wu, Steve Lin, "High-Level Synthesis: Introduction to Chip and System Design", Kluwer Academic Publishers, 1992, Japanese Patent Gazette No. 3150122 and the like.

There is a report that by adjusting the clock timings for respective registers (propagation delays from a clock source to respective registers) (semi-synchronous design), the clock frequency can be improved by 10% to 20% compared with zero-skew design (all registers have the same clock timing) (A. Takahashi, Y. Kajita, "Performance and Reliability Driven Clock Scheduling of Sequential Logic Circuits", Proc. Asia and South Pacific Design Automation Conference, pp. 37–42, 1997).

However, the conventional high level synthesis technology has a precondition that all registers have the same clock timing (zero-skew design). Therefore, the minimum number of pipelines required to satisfy a necessary clock frequency is three, for example, in the zero-skew design although it may be reduced to two if the semi-synchronous design is adopted.

There is proposed a technique of adjusting clock timings during register repositioning (retiming) as one function of the high level synthesis technology (Xun Liu, Marois C. Papaefthymiou, Edy G. Friedman, "Maximizing Performance by Retiming and Clock Skew Scheduling", Proc. Design Automation Conf, 1999). However, this technique, not aiming at reducing power consumption, fails to attain lower power consumption.

SUMMARY OF THE INVENTION

An object of the present invention is providing a high level synthesis method and apparatus capable of attaining lower power consumption.

The high level synthesis method of the present invention is a circuit synthesis method for automatically generating a register transfer level circuit description from a behavioral circuit description, wherein clock timings for registers are synthesized simultaneously during the synthesis of the register transfer level circuit description from the behavioral circuit description.

Preferably, the high level synthesis method described above includes the steps of generating a CDFG, scheduling the CDFG, allocating hardware, scheduling a clock and performing retiming. In the step of generating a CDFG, the behavioral circuit description is converted to a control data flow graph (CDFG). In the step of scheduling the CDFG, the CDFG is scheduled in such a way that the number of registers is minimized with a given number of clock cycles. In the step of allocating hardware, hardware is allocated to the CDFG scheduled in the step of scheduling the CDFG. In the step of scheduling a clock, the clock timings for the registers allocated in the step of allocating hardware are adjusted in such a way that the clock period is reduced. When the clock period obtained in the step of scheduling a clock is smaller than a desired clock period, the processing is terminated. In the step of performing retiming, the allocation of the registers to the CDFG in the step of allocating hardware is changed when the clock period obtained in the step of scheduling a clock is greater than the desired clock period. The processing returns to the step of scheduling a clock when the clock period is improved as a result of the step of performing retiming.

In the high level synthesis method described above, the scheduling of a CDFG is performed starting from the state that the number of registers is minimum toward a state having an increased number of registers in a search process, while adopting the clock timing adjustment technology for reduction of the clock period. Therefore, it is possible to implement hardware attaining a desired clock period with a smaller number of registers, compared with the conventional method involving no clock timing adjustment.

Preferably, in the step of scheduling a clock, the clock timings for the registers allocated in the step of allocating hardware are adjusted within the range of an adjustable width. The high level synthesis method further includes the step of extending, in which the adjustable width is extended when the clock period is not improved as a result of the step of performing retiming. The processing is terminated when the adjustable width obtained in the step of extending is greater than a predetermined threshold, and returns to the step of scheduling the CDFG when the adjustable width is smaller than the predetermined threshold.

Preferably, the step of scheduling a clock includes the steps of estimating a clock PD product, estimating a circuit PD product and improving the clock period selectively. In the step of estimating a clock PD product, clock power consumption expected when the clock period is reduced by adjusting clock timings for registers allocated in the step of allocating hardware is estimated, and the product of the reduced clock period and the estimated clock power consumption (clock PD product) is calculated. In the step of estimating a circuit PD product, circuit power consumption expected when the clock period is reduced by changing the hardware allocated in the step of allocating hardware to higher-speed hardware is estimated, and the product of the reduced clock period and the estimated circuit power consumption (circuit PD product) is calculated. In the step of improving the clock period selectively, the clock period reducing means in the step of estimating a clock PD product or the step of estimating a circuit PD product whichever is smaller in calculated PD product is executed.

Preferably, in the step of estimating a clock PD product and the step of estimating a circuit PD product, the power consumption is estimated in a situation that the rate of improvement of the clock period is suppressed below a limit value, and the step of estimating a clock PD product, the step of estimating a circuit PD product and the step of improving the clock period selectively are repeated until the clock period is no more improved.

Preferably, in the step of estimating a circuit PD product, the circuit power consumption is estimated based on the probability that the hardware operates within one clock period.

Preferably, in the step of estimating a clock PD product, the clock power consumption is estimated based on a function monotonously increasing with the adjustable width.

The high level synthesis apparatus of the present invention automatically generates a register transfer level circuit description from a behavioral circuit description, wherein clock timings for registers are synthesized simultaneously during the synthesis of the register transfer level circuit description from the behavioral circuit description.

Preferably, the high level synthesis apparatus includes a means for generating a CDFG, a means for scheduling the CDFG, a means for allocating hardware, a means for scheduling a clock and means for performing retiming. The means for generating a CDFG converts the behavioral circuit description to a control data flow graph (CDFG). The means for scheduling the CDFG schedules the CDFG in such a way that the number of registers is minimized with a given number of clock cycles. The means for allocating hardware allocates hardware to the CDFG scheduled by the means for scheduling the CDFG. The means for scheduling a clock adjusts the clock timings for the registers allocated by the means for allocating hardware in such a way that a clock period is reduced. When the clock period obtained by the means for scheduling a clock is smaller than the desired clock period, the high level synthesis apparatus terminates the processing. The means for performing retiming changes the allocation of the registers to the CDFG done by the means for allocating hardware when the clock period obtained by the means for scheduling a clock is greater than a desired clock period. The processing returns to processing by the means for scheduling a clock when the clock period is improved as a result of processing by the means for performing retiming.

Preferably, the means for scheduling a clock adjusts the clock timings for the registers allocated by the means for allocating hardware within a range of an adjustable width. The high level synthesis apparatus further includes a means for extending, which expends the adjustable width when the clock period is not improved as a result of the processing by the means for retiring. The high level synthesis apparatus terminates the processing when the adjustable width obtained by the means for extending is greater than a predetermined threshold, and returns to processing by the means for scheduling the CDFG when the adjustable width is smaller than the predetermined threshold.

Preferably, the means for scheduling a clock includes a means for estimating a clock PD product, a means for estimating a circuit PD product and a means for improving the clock period selectively. The means for estimating a clock PD product estimates clock power consumption expected when the clock period is reduced by adjusting the clock timings for the registers allocated by the means for allocating hardware, and calculates the product of the reduced clock period and the estimated clock power consumption (clock PD product). The means for estimating a circuit PD product estimates circuit power consumption expected when the clock period is reduced by changing the hardware allocated by the means for allocating hardware to higher-speed hardware, and calculates the product of the reduced clock period and the estimated circuit power consumption (circuit PD product). The means for improving the clock period selectively executes the clock period reduction means adopted by the means for estimating a clock PD product or the means for estimating a circuit PD product whichever is smaller in calculated PD product.

Preferably, the means for estimating a clock PD product and the means for estimating a circuit PD product estimate the power consumption in a situation that the rate of improvement of the clock period is suppressed below a limit value. The high level synthesis apparatus repeats processing by the means for estimating a clock PD product, processing by the means for estimating a circuit PD product and processing by the means for improving the clock period selectively until the clock period is no more improved.

Preferably, the means for estimating a circuit PD product estimates the circuit power consumption based on the probability that the hardware operates within one clock period.

Preferably, the means for estimating a clock PD product estimates the clock power consumption based on a function monotonously increasing with the adjustable width.

DESCRIPTION OF THE PREFERRED EMBODIMENTS

Figure 1:
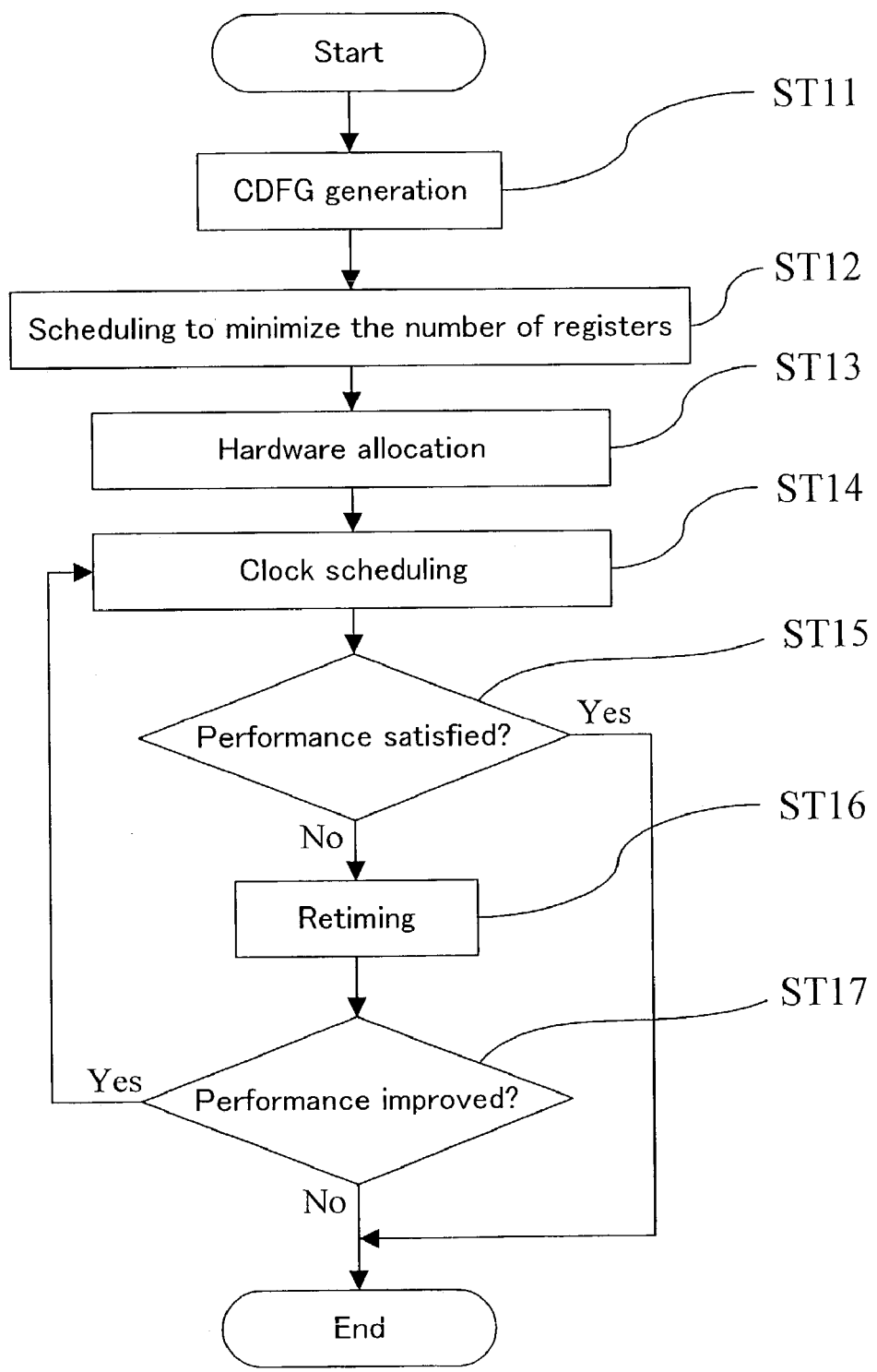
FIG. 1 is a flowchart showing a procedure of processing by a high level synthesis method of Embodiment 1 of the present invention.

Hereinafter, preferred embodiments of the present invention will be described with reference to the accompanying drawings. The same or like components are denoted by the same reference numerals throughout the drawings, and the description of such components will not be repeated.

Embodiment 1

FIG. 1 is a flowchart showing a procedure of processing by a high level synthesis method of Embodiment 1 of the present invention.

Referring to FIG. 1, in step ST11 (step of generating a CDFG), a behavioral description describing only behavior of processing is analyzed, and converted to a data structure called a control data flow graph (CDFG) that represents the dependencies of computations on one another in relation to the order of execution. An example of the CDFG is shown in FIG. 2, which is a CDFG representation of expression (1) below.

$$X = a \times b \times c \times d + e \times f \times g \times h - i/j/k/1 \qquad (1)$$

Figure 2:
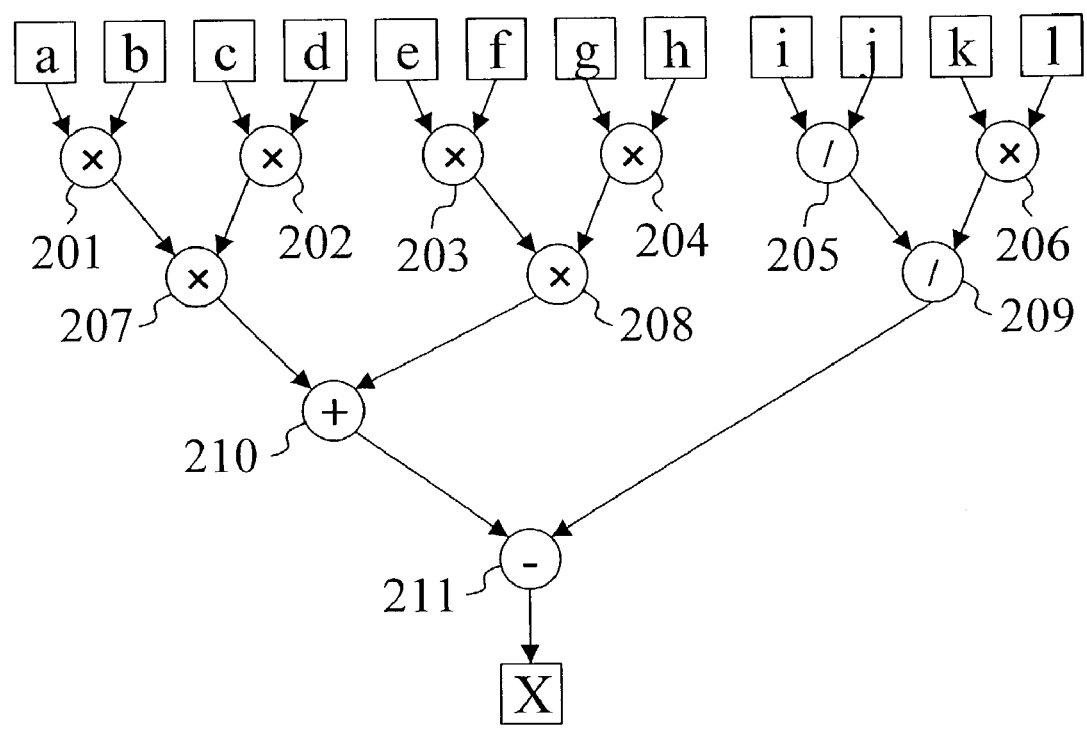
FIG. 2 shows an example of a control data flow graph.

As shown in FIG. 2, the CDFG is constructed of computations (201 to 211) and edges indicating signal flows between the computations.

Figure 3A:
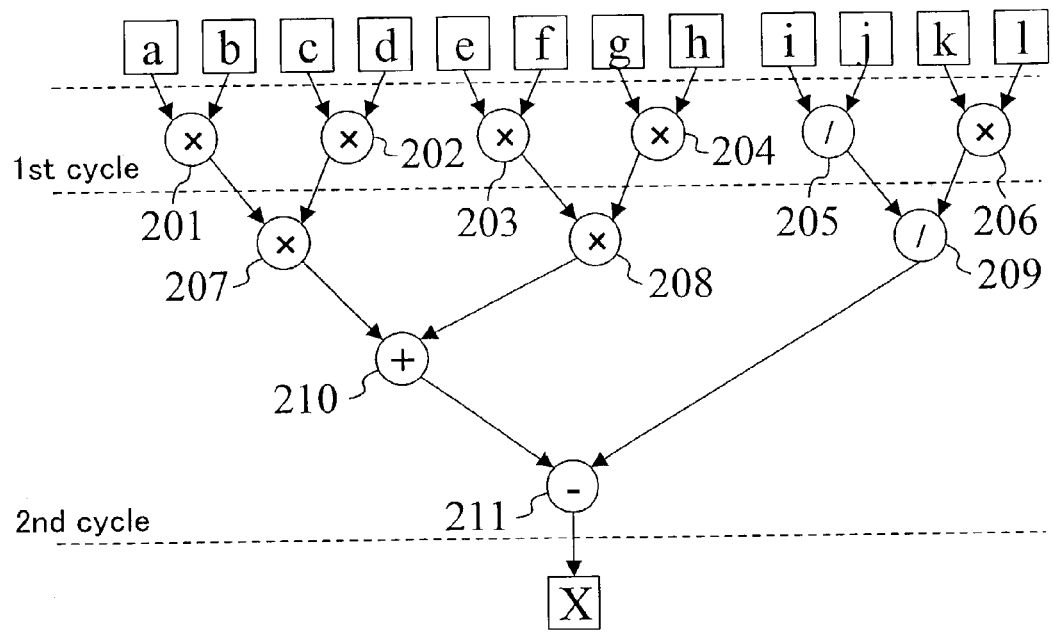
FIGS. 3A and 3B show examples of scheduling of the control data flow graph shown in FIG. 2.
Figure 3B:
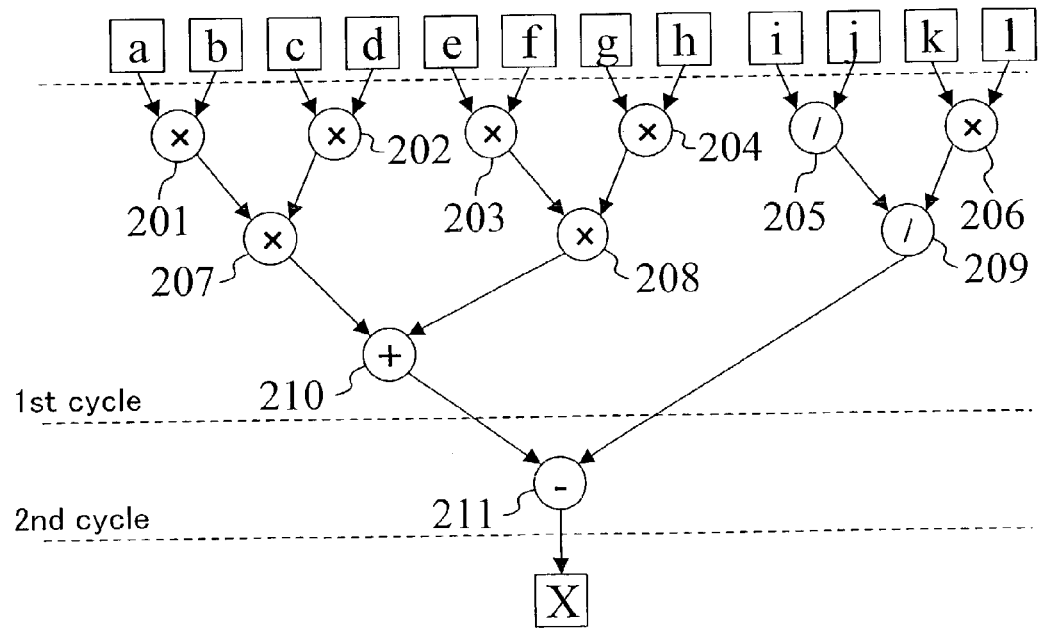

In step ST12 (step of scheduling the CDFG), scheduling is performed in such a way that the number of registers is minimized with a desired number of clock cycles. For example, when the CDFG shown in FIG. 2 is scheduled with the desired number of clock cycles set at 2, scheduled results as shown in FIGS. 3A and 3B are conceived. Registers are provided at respective intersections of two lines (intersections of the edges indicating data flow and the dashed lines indicating the boundary of clock cycles) in FIGS. 3A and 3B. It is found therefore that by adopting the scheduling shown in FIG. 3B, hardware can be implemented with a smaller number of registers. In the illustrated example, therefore, the scheduling is performed in the way shown in FIG. 3B.

Figure 4:
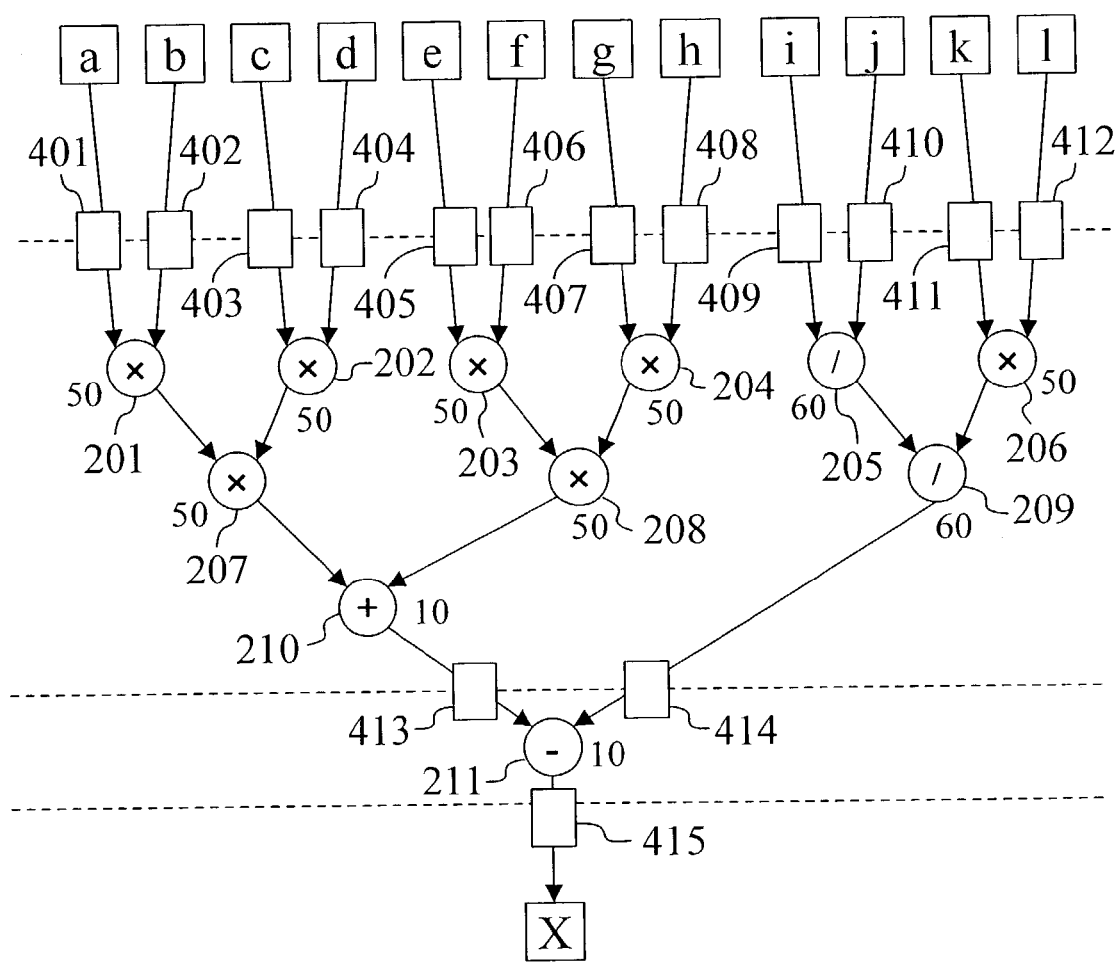
FIG. 4 shows a hardware allocated state of the scheduled control data flow graph shown in FIG. 3B.

In step ST13 (step of allocating hardware), as shown in FIG. 4, operators are allocated to the computations of the CDFG, registers (413 and 414) are allocated to the intersections of the edges indicating data flow and the boundary of the clock cycles, and input/output pins (401 to 412 and 415) are allocated to the input/output interfaces, to implement hardware. FIG. 4 shows a hardware-allocated state of the scheduled CDFG shown in FIG. 3B. The values shown near the respective computations in FIG. 4 indicate the operating rates of the allocated operators.

In step ST14 (step of scheduling a clock), the minimum clock period (semi-synchronous minimum clock period) attainable by adjusting the clock timings for the respective registers is determined for the hardware implemented. The semi-synchronous minimum clock period can be determined by following the method described in the literature cited above (A. Takahashi, Y. Kajitani, "Performance and Reliability Driven Clock Scheduling of Sequential Logic Circuits", Proc. Asia and South Pacific Design Automation Conference, pp. 37–42, 1997).

Figure 5A:
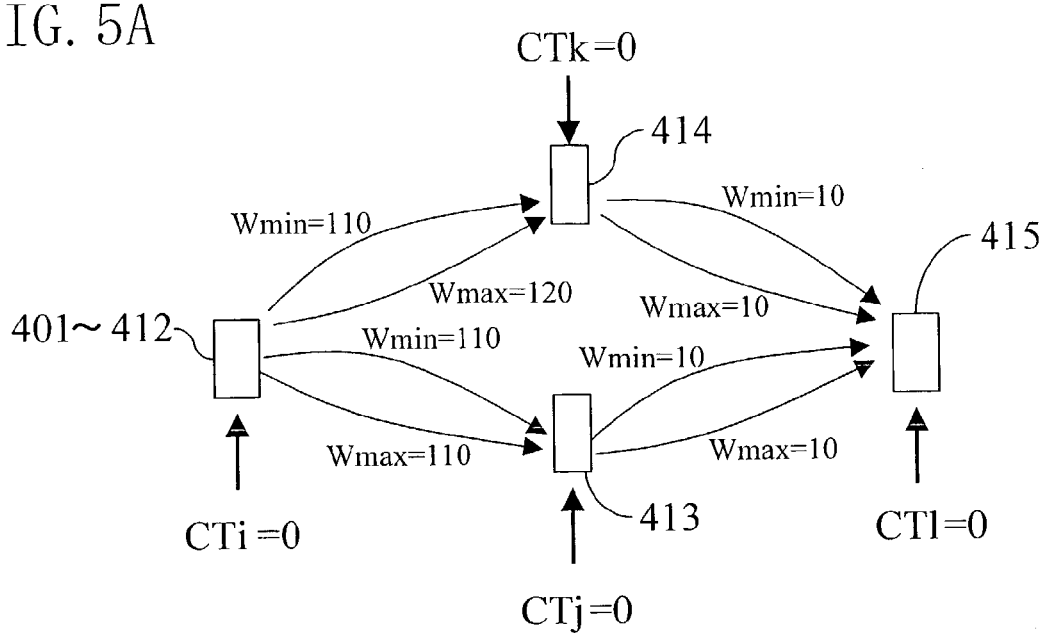
FIGS. 5A and 5B are views for demonstrating clock scheduling.
Figure 5B:
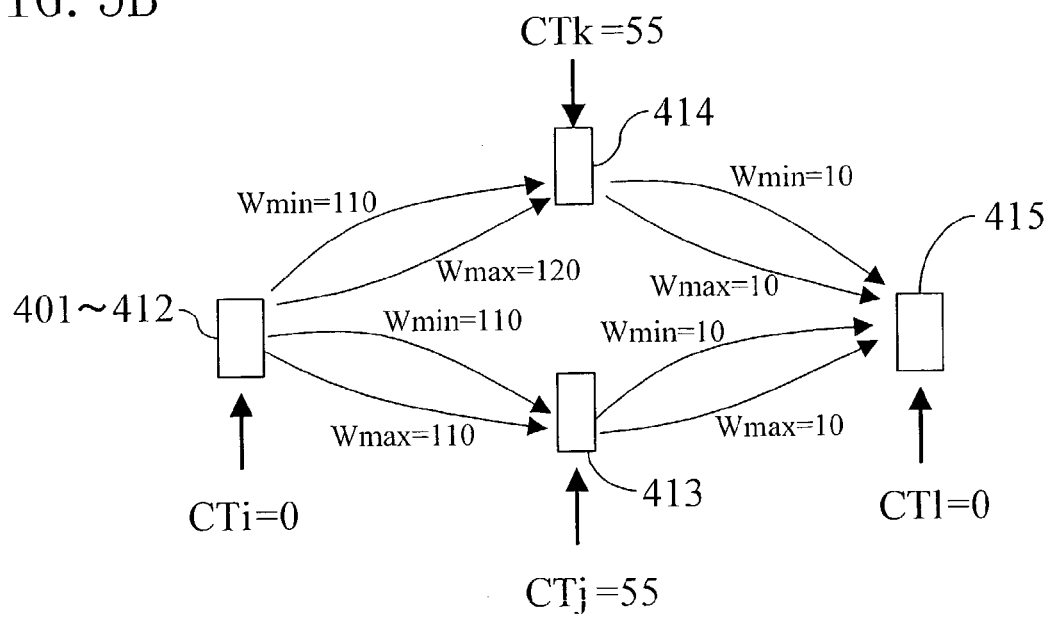

FIG. 5A illustrates a case of executing no clock scheduling for the hardware shown in FIG. 4 (zero skew), while FIG. 5B illustrates a case of executing clock scheduling for the hardware shown in FIG. 4. In FIGS. 5A and 5B, Wmin and Wmax respectively denote the maximum and minimum delays between the input/output pins (401 to 412) and the registers (413, 414) of the hardware, Cti, CTj, CTk and CTl denote clock timings. In FIG. 5A, all the clock timings are the same, and the minimum clock period attainable is 120. In FIG. 5B, in which the clock timings are adjusted by the clock scheduling, the minimum clock period (semi-synchronous minimum clock period) attainable is 65. In this way, the minimum clock period is shorter in the case of FIG. 5B in which the clock scheduling is executed.

In step ST15, the semi-synchronous minimum clock period is compared with a desired clock period. If the semi-synchronous minimum clock period is equal to or shorter than the desired clock period, it is determined that a given degree of performance is satisfied (Yes), and the processing is terminated. If the semi-synchronous minimum clock period is longer than the desired clock period, it is determined that the given degree of performance is not satisfied (No), and the processing proceeds to step ST16.

In step ST16 (step of performing retiming), all the clock timings are reset to a same value, and then the positions of the registers (allocation of the registers) in the CDFG are changed in such a way as to reduce the clock period. This processing is called retiming. The retiming can be performed by following the method described in C. E. Leiserson, J. H. Saxe, "Retiming Synchronous Circuitry", Algorithmica, Vol. 6, pp. 5–35.

In step ST17, whether or not the performance is improved by the retiming in step ST16 is determined. If improved, the processing returns to step ST14. If not improved, the processing is terminated.

As described above, in the high level synthesis method of Embodiment 1, the scheduling of a CDFG is performed starting from the state that the number of registers is minimum toward a state having an increased number of registers in a search process, while adopting the clock timing adjustment technology for reduction of the clock period. Therefore, it is possible to implement hardware attaining a desired clock period with a smaller number of registers, compared with the conventional method involving no clock timing adjustment.

Embodiment 2

Figure 6:
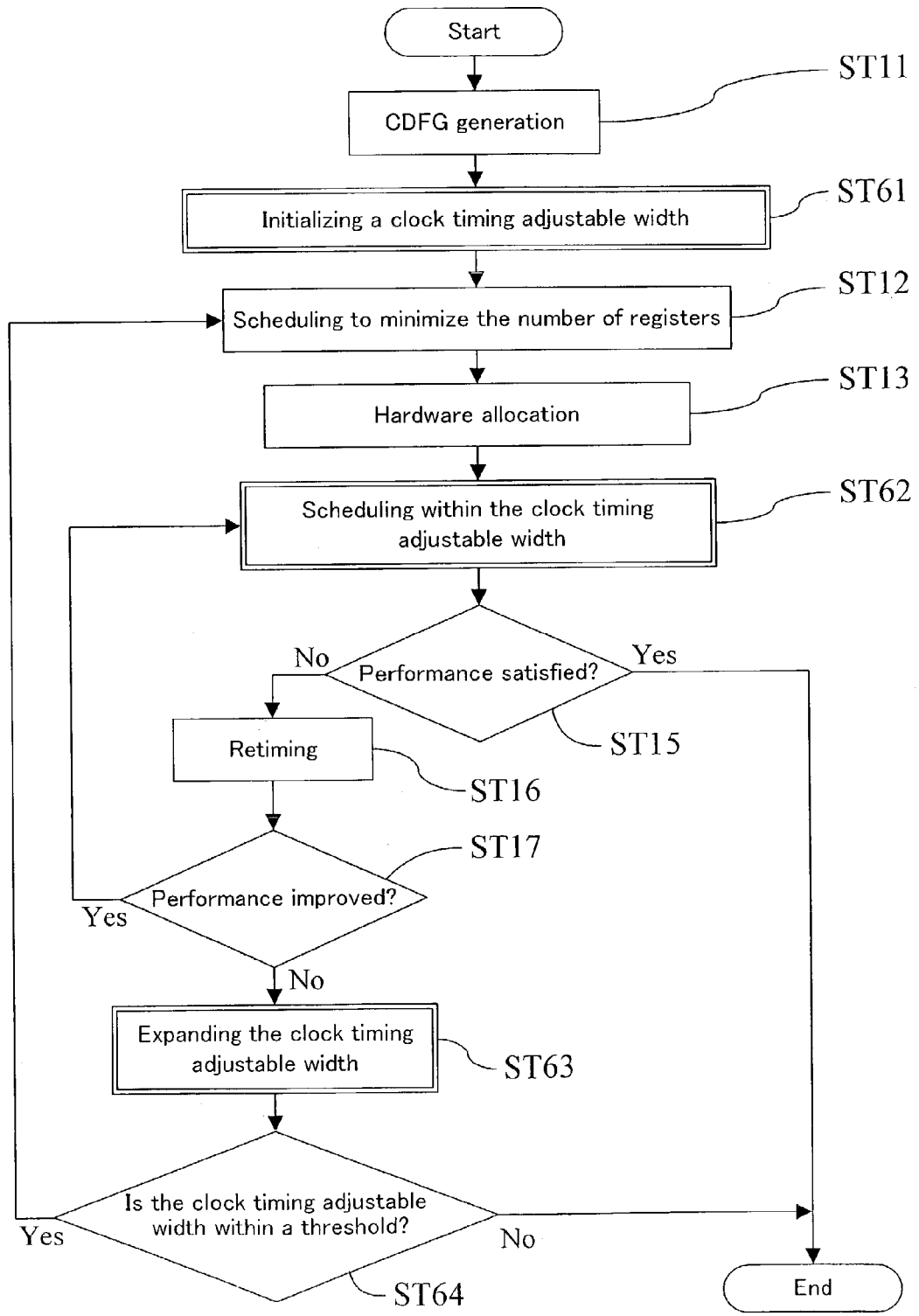
FIG. 6 is a flowchart showing a procedure of processing by a high level synthesis method of Embodiment 2 of the present invention.

FIG. 6 is a flowchart showing a procedure of processing by a high level synthesis method of Embodiment 2 of the present invention. A major difference of this high level synthesis method from that of Embodiment 1 is that the method of this embodiment imposes a limitation on the difference between the maximum and minimum clock timings for all registers (clock timing adjustment range) in determination of the semi-synchronous clock period.

The procedure of the high level synthesis method shown in FIG. 6 includes step ST62 in place of step ST14 in FIG. 1 and additionally includes steps ST61, ST63 and ST64.

In step ST61, provided between steps ST11 and ST12, the clock timing adjustment range (clock timing adjustable width) is initialized at a small value. For example, zero may be set as the small value, in which case the clock timings for all the registers are set at a same value.

In step ST62, the semi-synchronous clock period is determined under the limitation of the clock timing adjustment range. This clock scheduling under a limited clock timing adjustment range can be performed by following the method described in T. Yoda et al., "Clock Scheduling Considering Revision Cost for Speedup of Semi-Synchronous Circuit", VLD 99-36, IEICE Technical Report, 1999.

In the high level synthesis method of this embodiment, the processing is not terminated in step ST17 even when the performance is not improved by the retiming in step ST16, but steps ST63 and ST64 are executed. In step ST63 (step of extending), the clock timing adjustment range is extended by a fixed value. In step ST64, whether or not the clock timing adjustment range is within a fixed value (threshold) is determined. If the clock timing adjustment range is equal to or less than the threshold (Yes), the processing returns to step ST12. If it exceeds the threshold (No), the processing is terminated.

In the high level synthesis method of Embodiment 2, the clock timing adjustment range is gradually extended to finally determine the semi-synchronous clock period. This provides the possibility of generating clock timing information with a smaller clock timing adjustment range than in the high level synthesis method of Embodiment 1. In general, as the clock timing adjustment range is wider, the circuit for providing clock timings is larger at the layout design stage, and this increases power consumption of the clock circuit. Therefore, the high level synthesis method of Embodiment 2 is effective for an application in which increase of power consumption of the clock circuit is not desired.

Embodiment 3

Figure 7:
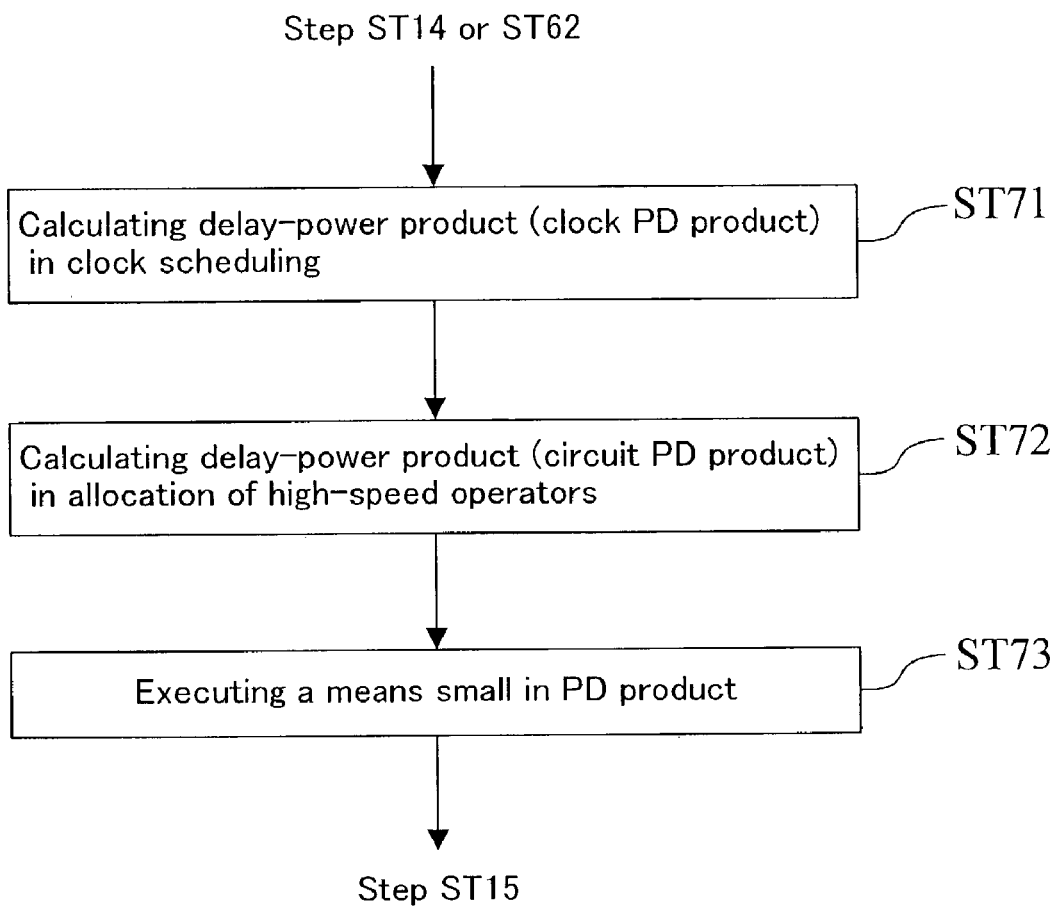
FIG. 7 is a flowchart showing a procedure of processing by the feature part of a high level synthesis method of Embodiment 3 of the present invention.

The high level synthesis method of Embodiment 3 of the present invention additionally includes steps ST71, ST72 and ST73 shown in FIG. 7 between steps ST14 and ST15 shown in FIG. 1 or between steps ST62 and ST15 shown in FIG. 6. The other procedure is the same as that of the high level synthesis method shown in FIG. 1 or 6.

Referring to FIG. 7, in step ST71 (step of estimating a clock PD product), clock power consumption expected when the clock period is reduced by the clock timing adjustment is estimated, and the product of the attained clock period and the estimated clock power consumption is calculated. In this relation, a function monotonously increasing with the clock timing adjustment range amount may be calculated in advance from the past layout results, and based on this function, the clock power consumption may be estimated. By estimating in this way, the estimation accuracy of the clock power consumption can be enhanced.

In step ST72 (step of estimating a circuit PD product), circuit power consumption expected when reallocation to higher-speed operators is performed is estimated, and the product of the attained clock period and the estimated circuit power consumption is calculated. In this relation, the probability that hardware such as an operator and a register operates within one clock period (operation probability) may be calculated, and the circuit power consumption may be estimated considering this operation probability. By estimating in this way, the estimation accuracy of the circuit power consumption can be enhanced.

In step ST73 (step of improving the clock period selectively), either step ST71 or ST72 whichever is smaller in calculated product value is selected, and the clock period improving means in the selected step is adopted for improving the clock period.

As described above, in the high level synthesis method of Embodiment 3, the clock period improving means capable of improving the clock period with higher efficiency is used (herein, the "higher efficiency" refers to providing a higher rate of improvement of the clock period with a lower rate of increase of power consumption). This enables synthesis of hardware attaining further low power consumption.

Moreover, in steps ST71 to ST73, the clock period improvement may be suppressed low intentionally, and these steps may be repeated until the clock period is no more improved. By adopting this way of improvement, the clock timing adjustment and the allocation of high-speed operators can be combined in a complicated way, and this will enable synthesis of hardware attaining further lower in power consumption.

As described above, according to the present invention, a circuit providing a desired clock frequency can be synthesized with a smaller number of registers, and thus lower power consumption is attained.

What is claimed is:

1. A high level synthesis method for automatically generating a register transfer level circuit description from a behavioral circuit description, wherein clock timings for registers are synthesized simultaneously during the synthesis of the register transfer level circuit description from the behavioral circuit description, wherein the method comprises the steps of:

generating a control data flow graph (CDFG) by converting the behavioral circuit description to the CDFG;

scheduling the CDFG in such a way that the number of registers is minimized with a given number of clock cycles;

allocating hardware to the CDFG scheduled in the step of scheduling the CDFG;

scheduling a clock by adjusting clock timings for registers allocated in the step of allocating hardware in such a way that a clock period is reduced; and performing retiming by changing the allocation of the registers to the CDFG in the step of allocating hardware when the clock period obtained in the step of scheduling a clock is greater than a desired clock period, wherein the synthesis method is terminated when the clock period obtained in the step of scheduling a clock is smaller than the desired clock period, and wherein the synthesis method returns to the step of scheduling a clock when the clock period is improved as a result of the step of performing retiming.

2. The method of claim 1, wherein in the step of scheduling a clock, the clock timings for the registers allocated in the step of allocating hardware are adjusted within a range of an adjustable width, the method further comprises the step of extending the adjustable width when the clock period is not improved as a result of the step of performing retiming, and the synthesis method is terminated when the adjustable width obtained in the step of extending is greater than a predetermined threshold, and returns to the step of scheduling the CDFG when the adjustable width is smaller than the predetermined threshold.

3. The method of claim 2, wherein the step of scheduling a clock comprises the steps of:

estimating a clock PD product by estimating clock power consumption expected when the clock period is reduced by adjusting the clock timings for the registers allocated in the step of allocating hardware and calculating the product of the reduced clock period and the estimated clock power consumption (clock PD product);

estimating a circuit PD product by estimating circuit power consumption expected when the clock period is reduced by changing the hardware allocated in the step of allocating hardware to higher-speed hardware and calculating the product of the reduced clock period and the estimated circuit power consumption (circuit PD product); and improving the clock period selectively by executing the clock period reducing means in the step of estimating a clock PD product or the step of estimating a circuit PD product whichever is smaller in calculated PD product.

4. The method of claim 3, wherein in the step of estimating a clock PD product and the step of estimating a circuit PD product, the power consumption is estimated in a situation that the rate of improvement of the clock period is suppressed below a limit value, and the step of estimating a clock PD product, the step of estimating a circuit PD product and the step of improving the clock period selectively are repeated until the clock period is no more improved.

5. The method of claim 4, wherein in the step of estimating a circuit PD product, the circuit power consumption is estimated based on the probability that the hardware operates within one clock period.

6. The method of claim 4, wherein in the step of estimating a clock PD product, the clock power consumption is estimated based on a function monotonously increasing with the adjustable width.

7. The method of claim 3, wherein in the step of estimating a circuit PD product, the circuit power consumption is estimated based on the probability that the hardware operates within one clock period.

8. The method of claim 3, wherein in the step of estimating a clock PD product, the clock power consumption is estimated based on a function monotonously increasing with the adjustable width.

9. The method of claim 1, wherein the step of scheduling a clock comprises the steps of:
estimating a clock PD product by estimating clock power consumption expected when the clock period is reduced by adjusting the clock timings for the registers allocated in the step of allocating hardware and calculating the product of the reduced clock period and the estimated clock power consumption (clock PD product);
estimating a circuit PD product by estimating circuit power consumption expected when the clock period is reduced by changing the hardware allocated in the step of allocating hardware to higher-speed hardware and calculating the product of the reduced clock period and the estimated circuit power consumption (circuit PD product); and
improving the clock period selectively by executing the clock period reduction means in the step of estimating a clock PD product or the step of estimating a circuit PD product whichever is smaller in calculated PD product.

10. The method of claim 9, wherein in the step of estimating a clock PD product and the step of estimating a circuit PD product, the power consumption is estimated in a situation that the rate of improvement of the clock period is suppressed below a limit value, and
the step of estimating a clock PD product, the step of estimating a circuit PD product and the step of improving the clock period selectively are repeated until the clock period is no more improved.

11. The method of claim 10, wherein in the step of estimating a circuit PD product, the circuit power consumption is estimated based on the probability that the hardware operates within one clock period.

12. The method of claim 10, wherein in the step of estimating a clock PD product, the clock power consumption is estimated based on a function monotonously increasing with the adjustable width.

13. The method of claim 9, wherein in the step of estimating a circuit PD product, the circuit power consumption is estimated based on the probability that the hardware operates within one clock period.

14. The method of claim 9, wherein in the step of estimating a clock PD product, the clock power consumption is estimated based on a function monotonously increasing with the adjustable width.

15. A high level synthesis apparatus for automatically generating a register transfer level circuit description from a behavioral circuit description, wherein clock timings for registers are synthesized simultaneously during the synthesis of the register transfer level circuit description from the behavioral circuit description,
wherein the apparatus comprises:
means for generating a control data flow graph (CDFG) by converting the behavioral circuit description to the CDFG;
means for scheduling the CDFG in such a way that the number of registers is minimized with a given number of clock cycles;
means for allocating hardware to the CDFG scheduled by the means for scheduling the CDFG;
means for scheduling a clock by adjusting clock timings for registers allocated by the means for allocating hardware in such a way that a clock period is reduced; and
means for performing retiming by changing the allocation of the registers to the CDFG done by the means for allocating hardware when the clock period obtained by the means for scheduling a clock is greater than a desired clock period,
wherein the synthesis performed by the apparatus is terminated when the clock period obtained by the means for scheduling a clock is smaller than the desired clock period, and
wherein the synthesis performed by the apparatus returns to processing by the means for scheduling a clock when the clock period is improved as a result of processing by the means for performing retiming.

16. The apparatus of claim 15, wherein the means for scheduling a clock adjusts the clock timings for the registers allocated by the means for allocating hardware within a range of an adjustable width,
the apparatus further comprises means for extending the adjustable width when the clock period is not improved as a result of the processing by the means for retiming, and
the synthesis performed by the apparatus is terminated when the adjustable width obtained by the means for extending is greater than a predetermined threshold, and returns to processing by the means for scheduling the CDFG when the adjustable width is smaller than the predetermined threshold.

17. The apparatus of claim 16, wherein the means for scheduling a clock comprises:
means for estimating a clock PD product by estimating clock power consumption expected when the clock period is reduced by adjusting the clock timings for the registers allocated by the means for allocating hardware and calculating the product of the reduced clock period and the estimated clock power consumption (clock PD product);
means for estimating a circuit PD product by estimating circuit power consumption expected when the clock period is reduced by changing the hardware allocated by the means for allocating hardware to higher-speed hardware and calculating the product of the reduced clock period and the estimated circuit power consumption (circuit PD product); and
improving the clock period selectively by executing the clock period reduction means adopted by the means for estimating a clock PD product or the means for estimating a circuit PD product whichever is smaller in calculated PD product.

18. The apparatus of claim 17, wherein the means for estimating a clock PD product and the means for estimating a circuit PD product estimate the power consumption in a situation that the rate of improvement of the clock period is suppressed below a limit value, and
processing by the means for estimating a clock PD product, processing by the means for estimating a circuit PD product and processing by the means for improving the clock period selectively are repeated until the clock period is no more improved.

19. The apparatus of claim 18, wherein the means for estimating a circuit PD product estimates the circuit power consumption based on the probability that the hardware operates within one clock period.

20. The apparatus of claim 18, wherein the means for estimating a clock PD product estimates the clock power consumption based on a function monotonously increasing with the adjustable width.

21. The apparatus of claim 17, wherein the means for estimating a circuit PD product estimates the circuit power consumption based on the probability that the hardware operates within one clock period.

22. The apparatus of claim 17, wherein the means for estimating a clock PD product estimates the clock power consumption based on a function monotonously increasing with the adjustable width.

23. The apparatus of claim 15, wherein the means for scheduling a clock comprises:

means for estimating a clock PD product by estimating clock power consumption expected when the clock period is reduced by adjusting the clock timings for the registers allocated by the means for allocating hardware and calculating the product of the reduced clock period and the estimated clock power consumption (clock PD product);

means for estimating a circuit PD product by estimating circuit power consumption expected when the clock period is reduced by changing the hardware allocated by the means for allocating hardware to higher-speed hardware and calculating the product of the reduced clock period and the estimated circuit power consumption (circuit PD product); and improving the clock period selectively by executing the clock period reduction means adopted by the means for estimating a clock PD product or the means for estimating a circuit PD product whichever is smaller in calculated PD product.

24. The apparatus of claim 23, wherein the means for estimating a clock PD product and the means for estimating a circuit PD product estimate the power consumption in a situation that the rate of improvement of the clock period is suppressed below a limit value, and processing by the means for estimating a clock PD product, processing by the means for estimating a circuit PD product and processing by the means for improving the clock period selectively are repeated until the clock period is no more improved.

25. The apparatus of claim 24, wherein the means for estimating a circuit PD product estimates the circuit power consumption based on the probability that the hardware operates within one clock period.

26. The apparatus of claim 24, wherein the means for estimating a clock PD product estimates the clock power consumption based on a function monotonously increasing with the adjustable width.

27. The apparatus of claim 23, wherein the means for estimating a circuit PD product estimates the circuit power consumption based on the probability that the hardware operates within one clock period.

28. The apparatus of claim 23, wherein the means for estimating a clock PD product estimates the clock power consumption based on a function monotonously increasing with the adjustable width.

29. A high level synthesis method for automatically generating a register transfer level circuit description from a behavioral circuit description, the method comprising the steps of:

generating a control data flow graph (CDFG) by converting the behavioral circuit description to the CDFG;

scheduling the CDFG in such a way that a number of registers is minimized with a given number of clock cycles, wherein clock timings for registers, which are timings of clock edges to provide clocks for the registers, are synthesized during the synthesis of the register transfer level circuit description from the behavioral circuit description, and wherein at least two of said clock timings are different.

30. The high level synthesis method of claim 29, wherein in the step of scheduling the CDFG, the number of registers is minimized by minimizing the number of intersections of the edges indicating data flow and the lines indicating the boundary of clock cycles.

31. A high level synthesis apparatus for automatically generating a register transfer level circuit description from a behavioral circuit description, said apparatus comprising:

means for generating a control data flow graph (CDFG) by converting the behavioral circuit description to the CDFG;

means for scheduling the CDFG in such a way that a number of registers is minimized with a given number of clock cycles;

wherein clock timings for registers, which are timings of clock edges to provide clocks for the registers, are synthesized during the synthesis of the register transfer level circuit description from the behavioral circuit description, and wherein at least two of said clock timings are different.

32. The high level synthesis apparatus of claim 31, wherein in the step of scheduling the CDFG, the number of registers is minimized by minimizing the number of intersections of the edges indicating data flow and the lines indicating the boundary of clock cycles.

* * * * *